(12) United States Patent
Matsunaga

(10) Patent No.: US 8,929,117 B2
(45) Date of Patent: Jan. 6, 2015

(54) MULTI-CHIP PACKAGE AND MEMORY SYSTEM

(71) Applicant: Kabushiki Kaisha Toshiba, Tokyo (JP)

(72) Inventor: Naoki Matsunaga, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 135 days.

(21) Appl. No.: 13/773,305

(22) Filed: Feb. 21, 2013

(65) Prior Publication Data

US 2013/0250643 A1 Sep. 26, 2013

(30) Foreign Application Priority Data

Mar. 23, 2012 (JP) ................................. 2012-067031

(51) Int. Cl.
  *G11C 5/02* (2006.01)
  *G11C 5/06* (2006.01)
  *G11C 7/10* (2006.01)
  *G11C 8/12* (2006.01)

(52) U.S. Cl.
  CPC ............... *G11C 5/06* (2013.01); *G11C 7/1015* (2013.01); *G11C 8/12* (2013.01); *G11C 5/02* (2013.01); *G11C 7/10* (2013.01)
  USPC .................. 365/51; 365/52; 365/63

(58) Field of Classification Search
  CPC .......... G11C 5/06; G11C 5/04; G11C 7/1015; G11C 8/12; G11C 7/10; G11C 5/02
  USPC ........ 365/51, 52, 63, 191, 198; 257/656, 713, 257/690
  See application file for complete search history.

(56) References Cited

U.S. PATENT DOCUMENTS

| | | | |
|---|---|---|---|
| 5,768,584 A | 6/1998 | MacDonald et al. | |
| 7,126,873 B2 | 10/2006 | See et al. | |
| 7,212,422 B2* | 5/2007 | Koide | 365/51 |
| 8,254,155 B1* | 8/2012 | Crisp et al. | 365/63 |
| 8,312,240 B2 | 11/2012 | Takemae | |
| 8,513,817 B2* | 8/2013 | Haba et al. | 257/778 |
| 2002/0073272 A1 | 6/2002 | Ko et al. | |
| 2002/0118593 A1 | 8/2002 | Takemae | |
| 2005/0162946 A1 | 7/2005 | Koide | |
| 2008/0074930 A1 | 3/2008 | Kanda | |

FOREIGN PATENT DOCUMENTS

| | | |
|---|---|---|
| JP | 3670041 B | 8/1995 |
| JP | 1097463 A | 4/1998 |
| JP | 4722305 B | 9/2002 |

(Continued)

OTHER PUBLICATIONS

Japanese Office Action for JP application No. 2012-067031, mailed Jun. 17, 2014.

*Primary Examiner* — Gene Auduong
(74) *Attorney, Agent, or Firm* — Patterson & Sheridan, LLP

(57) ABSTRACT

A multi-chip package includes a first group of memory chips that includes a first memory chip and a second memory chip, a second group of memory chips that includes at least one memory chip, a first internal wiring system that couples the first memory chip and the second memory chip to a first terminal configured to receive a chip-enable signal, a second internal wiring system that couples the at least one memory chip to a second terminal configured to receive the chip-enable signal. The first memory chip and the second memory chip each include a chip address memory region configured to store an address associated with the memory chip, and an address rewrite module configured to rewrite the address associated with the memory chip and stored in the chip address memory region in response to an external operation.

20 Claims, 11 Drawing Sheets

(56) References Cited

FOREIGN PATENT DOCUMENTS

| JP | 20037963 | A | 1/2003 |
| JP | 2005209814 | A | 8/2005 |
| JP | 2012018639 | A | 1/2012 |
| WO | 2011002663 | A | 1/2011 |

* cited by examiner

MULTI-CHIP PACKAGE AND MEMORY SYSTEM

CROSS-REFERENCE TO RELATED APPLICATION

This application is based upon and claims the benefit of priority from Japanese Patent Application No. 2012-067031, filed Mar. 23, 2012, the entire contents of which are incorporated herein by reference.

FIELD

Embodiments described herein relate to a multi-chip package and a memory system.

BACKGROUND

Lately interest has been directed to the SSD (solid-state drive), which carries a memory chip that has NAND-type memory cells as a memory system adopted in a computer system. Different from the magnetic disk device, the SSD has the advantages of a high speed of operation, being lightweight, etc.

Given a limited pin count and assembly area for the transfer controller that executes the access control of the memory chip, to maximize capacity, SSDs can be configured with a multi-chip package that has multiple laminated memory chips.

DETAILED DESCRIPTION

Embodiments provide a multi-chip package and a memory system associated therewith that can realize greater flexibility for the memory system.

In general, a detailed description according to embodiments will be explained with reference to the included figures. However, the present disclosure is not limited to these embodiments. Here, as an example of the memory chips, the memory chips that have NAND-type memory cells will be explained. However, the object of application for the present embodiment is not limited to the NAND-type memory chips. In addition, in some embodiments, the multiple memory chips may not necessarily be laminated inside the multi-chip package.

According to an embodiment of the present disclosure, a multi-chip package includes a first group of memory chips that includes a first memory chip and a second memory chip, a second group of memory chips that includes at least one memory chip, a first internal wiring system that couples the first memory chip and the second memory chip to a first terminal configured to receive a chip-enable signal, a second internal wiring system that couples the at least one memory chip to a second terminal configured to receive the chip-enable signal. The first memory chip and the second memory chip each include a chip address memory region configured to store an address associated with the memory chip, and an address rewrite module configured to rewrite the address associated with the memory chip and stored in the chip address memory region in response to an external operation.

First Embodiment

Figure 1:
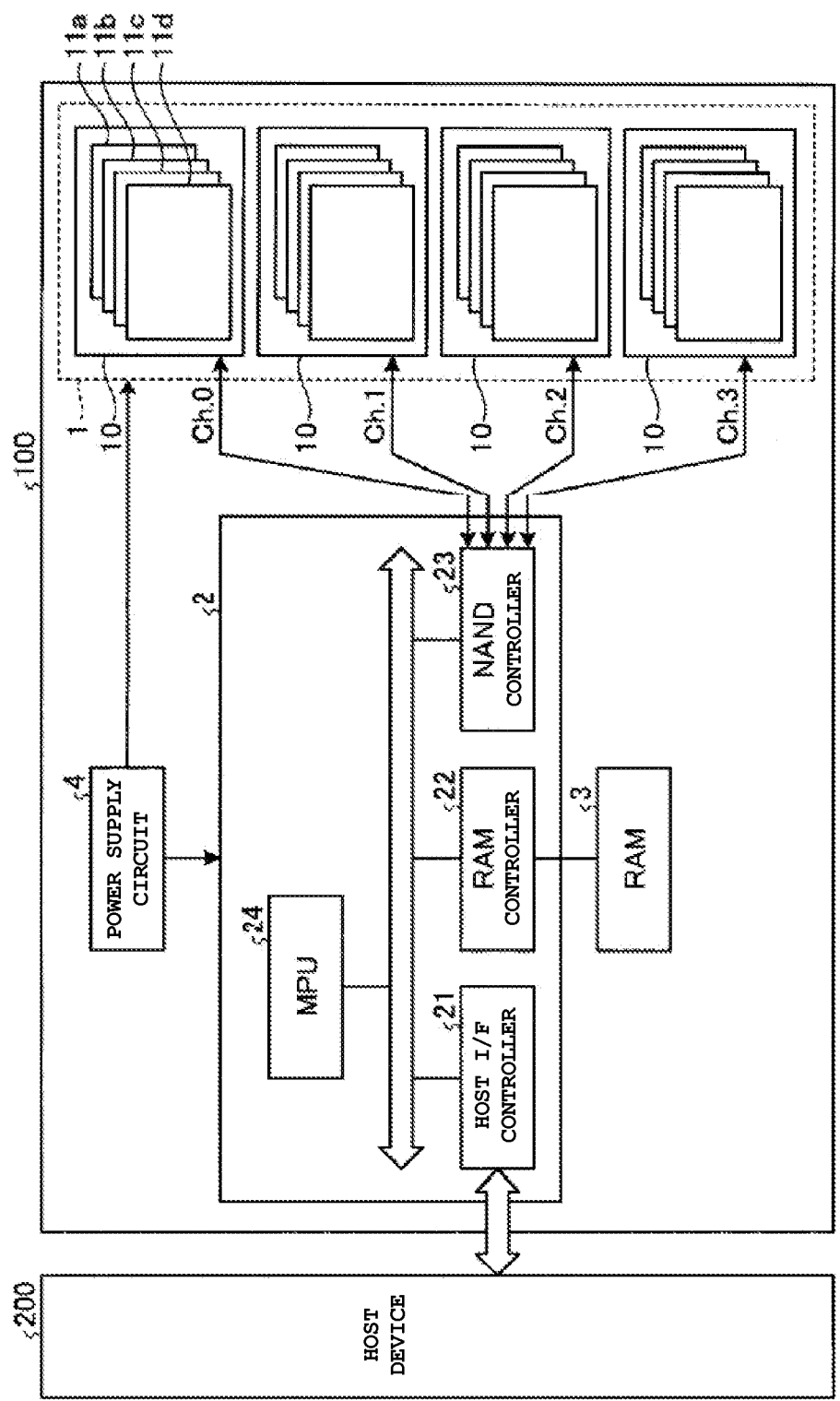
FIG. 1 is a diagram illustrating an example of assembly of the multi-chip package on the SSD according to a first embodiment.

FIG. 1 is a diagram illustrating an example of the multi-chip package on the SSD according to a first embodiment of the present disclosure. As shown in the figure, the SSD 100 is connected to the personal computer or other host device 200 by a standard ATA (Advanced Technology Attachment, SATA) or other communication interface, and it functions as the external memory device of the host device 200. However, the communication interface connecting the SSD 100 and the host device 200 is not limited to the SATA standard. For example, one may also adopt an SAS (Serial Attached SCSI), a PCIe (PCI Express) or various other types of communication interface standards.

The SSD 100 has a NAND memory 1, a transfer controller 2 that executes data transfer between the host device 200 and the NAND memory 1, a RAM 3 as a volatile memory for temporarily storing the transfer data from the transfer controller 2, and a power supply circuit 4. The data sent from the host device 200 are stored in the RAM 3 under the control of the transfer controller 2. Then, the data are read from the RAM 3 and are written in the NAND memory 1. The power supply circuit 4 generates the internal power supply to drive the transfer controller 2 and the NAND memory 1, and the generated internal power is fed to the transfer controller 2 and the NAND memory 1.

The NAND memory 1 is composed of several (4 in this example) multi-chip packages 10 each having multiple (4 in this example) memory chips 11*a* to 11*d*. The multi-chip packages 10 are connected to the transfer controller 2 by connecting wires of different channels (Ch. 0 to Ch. 3). Here, the multi-chip packages are controlled independently for each channel. Thus, the four multi-chip packages 10 are connected to the transfer controller 2 so that they can carry out operations in parallel at the same time. Also, the connection wiring of each channel contains the I/O signal line, the control signal line, and the R/B signal line. In the following sections, the "signal line" may be abbreviated as "signal". The control signals include the chip-enable signal (CE), the command-latch enable signal (CLE), the address-latch enable signal (ALE), the write-enable signal (WE), the read-enable signal (RE), the write-protect signal (WP), and the data strobe signal (DQS). In the following section, the connection relationship between the multi-chip package 10 and the transfer controller 2 in the assembly example shown in FIG. 1 will be taken as Connection Example 1.

The transfer controller 2 also has the following parts: a host interface controller (host I/F controller) 21 that executes control of the communication interface with the host device 200 and control of the data transfer between the host device 200 and the RAM 3, a RAM controller 22 that executes control of read/write of the data for RAM 3, a NAND controller 23 that executes control of data transfer between the NAND memory 1 and the RAM 3, and an MPU 24 that executes the overall control of the transfer controller 2 on the basis of the firmware.

On the basis of the read instruction/write instruction/deletion instruction from the MPU 24, the NAND controller 23 sends the I/O signal and the control signal to the multi-chip package 10 of the desired channel. The memory chips 11a to 11d contained in the multi-chip package 10 of the corresponding channel can execute the operation corresponding to the contents of the received signal.

Figure 2:
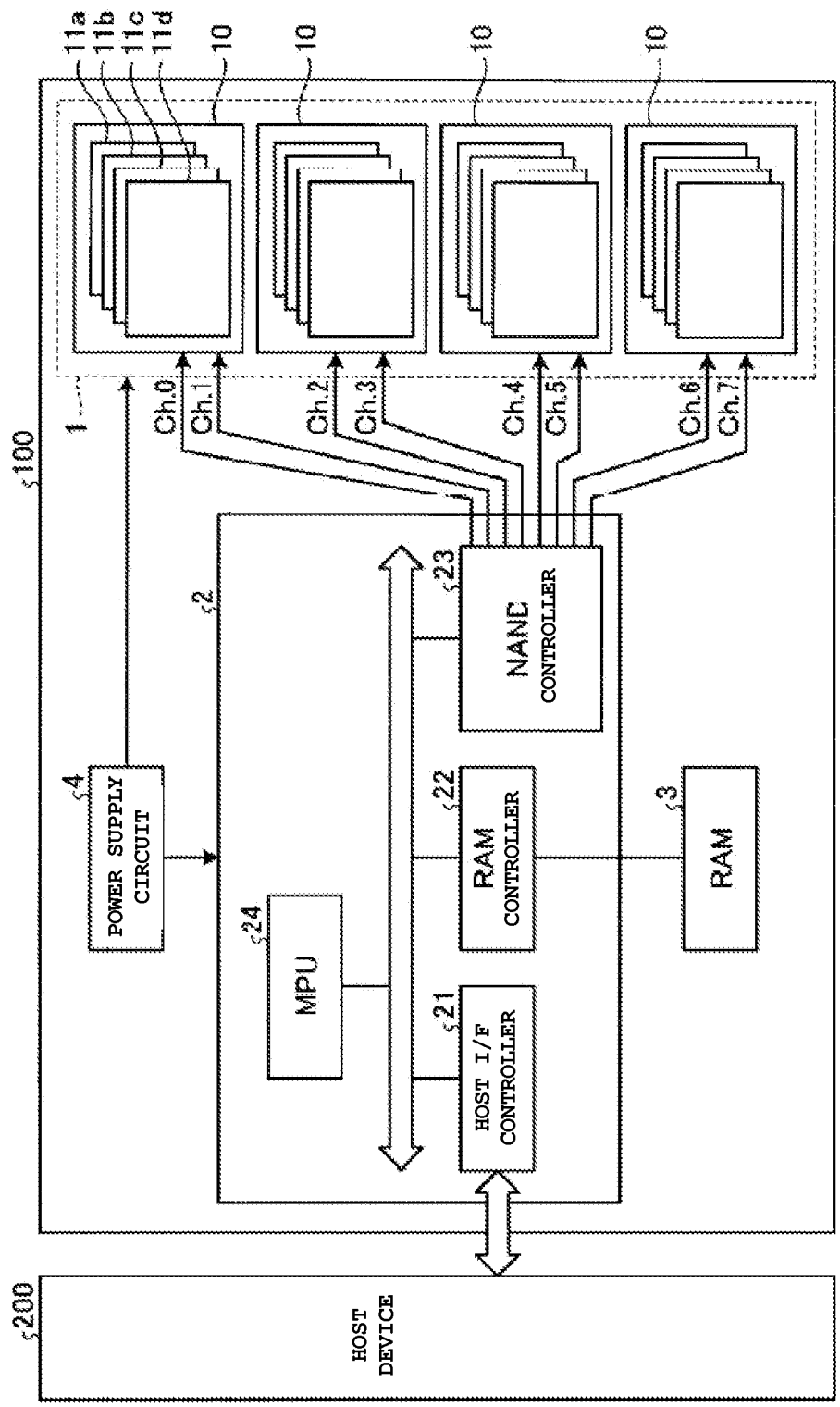
FIG. 2 is a diagram illustrating another example of assembly of the multi-chip package on the SSD of the first embodiment.

FIG. 2 is a diagram illustrating another example of assembling the multi-chip package 10 on the SSD 100 that is according to the first embodiment of the present disclosure. According to the assembly example shown in FIG. 2, each multi-chip package 10 is connected to the transfer controller 2 so that it is controlled by the wiring of 2 channels. That is, the four memory chips 11a to 11d of each multi-chip package 10 are classified into 2 groups that are each controlled through a different channel. In the following, the connection relationship between the multi-chip package 10 and the transfer controller 2 in the assembly example shown in FIG. 2 will be referred to as Connection Example 2.

According to the first embodiment of the present disclosure, the internal wiring of the multi-chip package 10 and the arrangement of the memory chips 11a to 11d are designed appropriately to ensure that after manufacturing of the multi-chip package 10, any of the connection relationships in Connection Example 1 and Connection Example 2 may be adopted.

Figure 3:
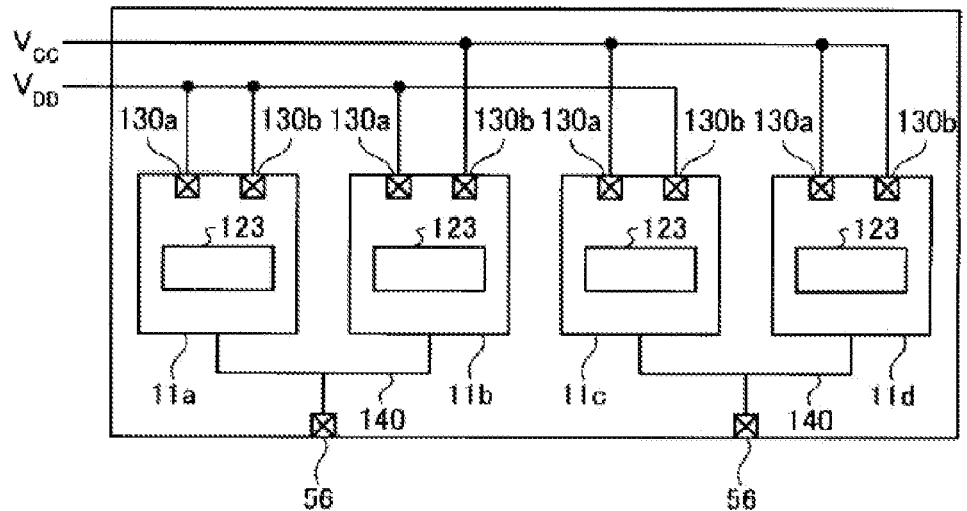
FIG. 3 is a diagram illustrating the internal wiring of the multi-chip package before assembly on the SSD.

FIG. 3 is a diagram illustrating the internal wiring of the multi-chip package 10 before assembly on the SSD 100. As shown in the figure, the memory chips 11a to 11d each have two chip address-setting pins 130a, 130b. The chip address-setting pins 130a, 130b each are connected to either the power supply potential Vcc or the ground potential Vdd. The supply and ground potentials are connected to the chip address-setting pins 130a, 130b that are included in the memory chips 11a to 11d appropriately to ensure that a unique combination is made in each multi-chip package 10. The combination of the potentials set at the chip address-setting pins 130a, 130b works as the chip address of the initial state for identifying the memory chips 11a to 11d with respect to each other. In this embodiment, the state when the power supply potential Vcc is connected is taken as H(1), and the state when the ground potential Vdd is connected is taken as L(0). Thus, the state of the chip address-setting pin 130a indicates the high-order digits CADD0 of the chip address CADD, and the state of the chip address-setting pin 130b indicates the low-order digits CADD1 of the chip address. For example, in the memory chip 11a, both of the chip address-setting pins 130a, 130b are connected to the ground potential Vdd, and the chip address of "00" is set as the initial state. Also, in the memory chips 11b to 11d, "01", "10", and "11" are set as the chip addresses of their initial states, respectively.

In one embodiment, the memory chips 11a to 11d each have a chip address register (chip address memory region) 123 for storing the set value of the chip address. The memory chips 11a to 11d can each use the value stored in the chip address register 123 included in their own memory chip as the chip address set for their own memory chip. The chip address register 123 stores the chip addresses CADD0, CADD1 input from the chip address-setting pins 130a, 130b as the chip addresses of the initial state. Furthermore, the chip address register 123 can be configured to allow rewrite of the stored chip address of the initial state by the prescribed command (such as test command) from the transfer controller 2.

Also, the I/O signal line, the R/B signal line, and the control signal line (especially CE) are commonly connected as part of the internal wiring 140 in a multi-chip package to separate sub-groups of the memory chips, where each sub-group of memory chips includes fewer memory chips that the total number of the memory chips that form the multi-chip package 10 inside the same multi-chip package 10. For example, memory chip 11a and memory chip 11b are commonly connected to each other by the various types of signal lines by the internal wiring 140 and form one signal line group, and memory chip 11c and memory chip 11d are commonly connected by the various types of the signal lines by the internal wiring 140 and form another signal line group. The internal wiring 140 is connected to the solder balls (terminals) 56 arranged for the various portions of the internal wiring 140, respectively. In other words, the internal wiring 140 for each signal line group is connected to a different solder ball (terminal) 56 and the internal wiring 140 for other signal line groups. In addition, the signal line group that makes common connections for memory chip 11a and memory chip 11b is denoted as the 0-series signal line group, and the CE line, R/B line, and I/O line that form the 0-series signal line group are represented by CE0, R/B0, and I/O-0, respectively. Similarly, the signal line group that commonly connects memory chip 11c and memory chip 11d is represented by the 1-series signal line group. The CE line, R/B line, and I/O line that form the 1-series signal line group are denoted as CE1, R/B1, and I/O-1, respectively.

In this way, the multi-chip package 10 has an arrangement in which the various types of signal lines are commonly connected for each group of the memory chips in a number smaller than the number of the memory chips that form the multi-chip package 10 inside the multi-chip package, and, at the same time, the various memory chips 11a to 11d can be installed in a multi-chip package according to either Connection Example 1 or Connection Example 2 without being specifically manufactured for either connection example.

Figure 4:
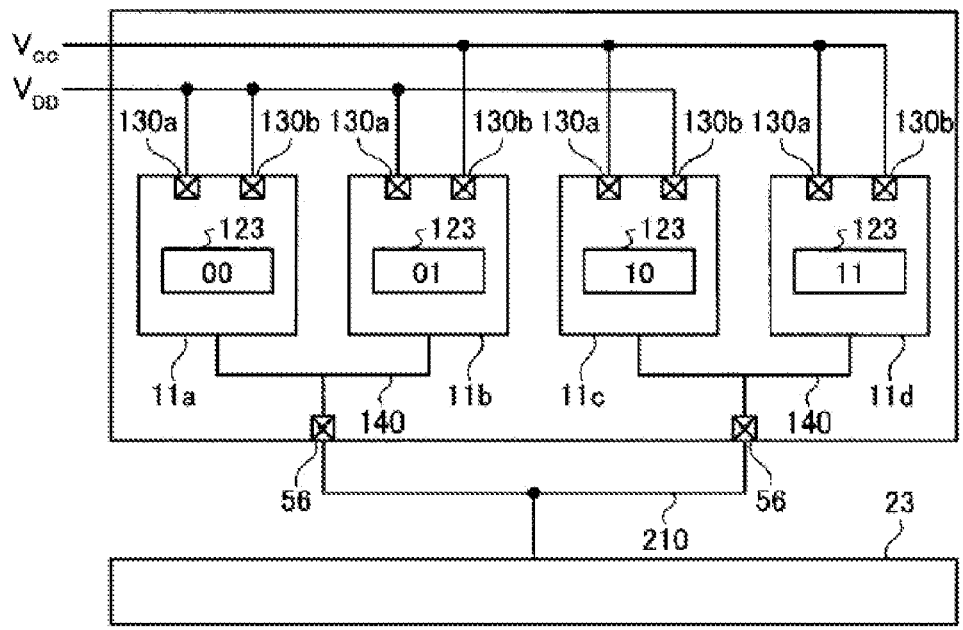
FIG. 4 is a diagram illustrating an example of wiring when the multi-chip package is assembled on the SSD according to a first connection example.

FIG. 4 is a diagram illustrating an example of wiring when the multi-chip package 10 is assembled on the SSD 100 with the connection relationship according to Connection Example 1. When Connection Example 1 is adopted, the 0-series signal line group and the 1-series signal line group are combined in a single connection wiring 210 out of the multi-chip package 10, and they are connected as a single-chamber signal line group to the transfer controller 2 (or more accurately, NAND controller 23). That is, the CE0 and CE1 are connected out of the multi-chip package 10, and they are connected to the transfer controller 2. Similarly, R/B0 and R/B1 are connected out of the multi-chip package 10, and they are connected to the transfer controller 2, and I/O-0 and I/O-1 are connected out of the multi-chip package 10, and they are connected to the transfer controller 2. The memory chips 11a to 11d do not execute rewrite of the contents of the chip address registers 123 equipped in them. That is, in operation, "00", "01", "10" and "11" are adopted as the chip addresses of the initial state of the memory chips 11a to 11d, respectively.

Figure 5:
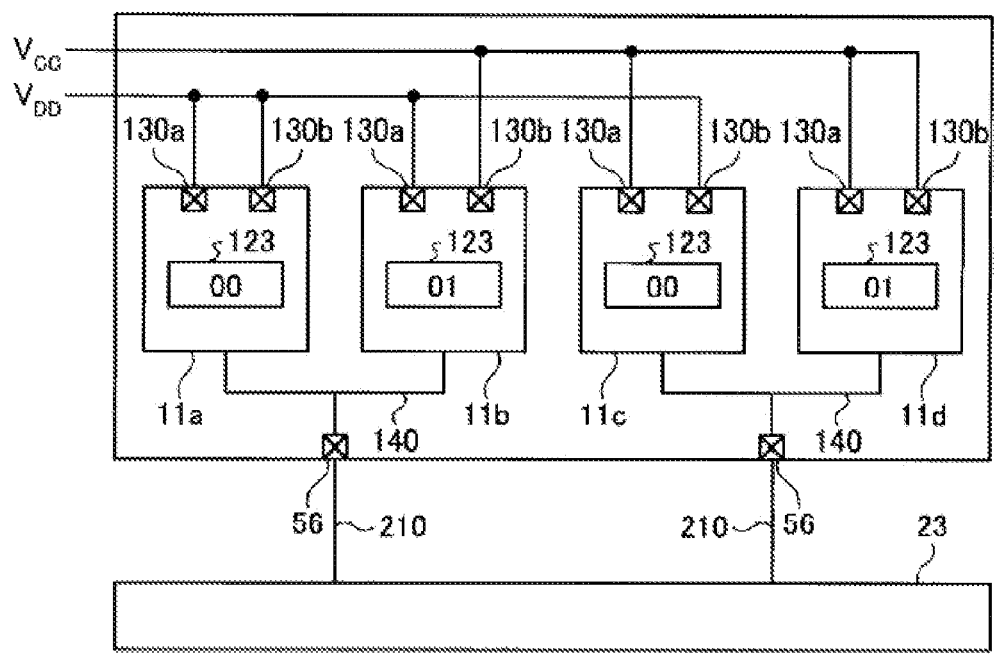
FIG. 5 is a diagram illustrating an example of wiring when the multi-chip package is assembled on the SSD according to a second connection example.

FIG. 5 is a diagram illustrating an example of wiring when the multi-chip package 10 is assembled on the SSD 100 with the connection relationship in Connection Example 2. When Connection Example 2 is adopted, the 0-series signal line group and the 1-series signal line group are independently connected to the transfer controller 2 (or more accurately, NAND controller 23) because the signal line groups with different channels use separate portions of the connection wiring 210. Then, after start up, the contents of the chip address registers 123 disposed in the memory chips 11c and 11d are rewritten to the chip addresses that can identify the memory chips 11c and 11d that are connected to the 1-series signal line group. That is, the chip address of "00" is set as the chip address of memory chip 11c, and the chip address of "01" is set as the chip address of memory chip 11d.

Figure 6:
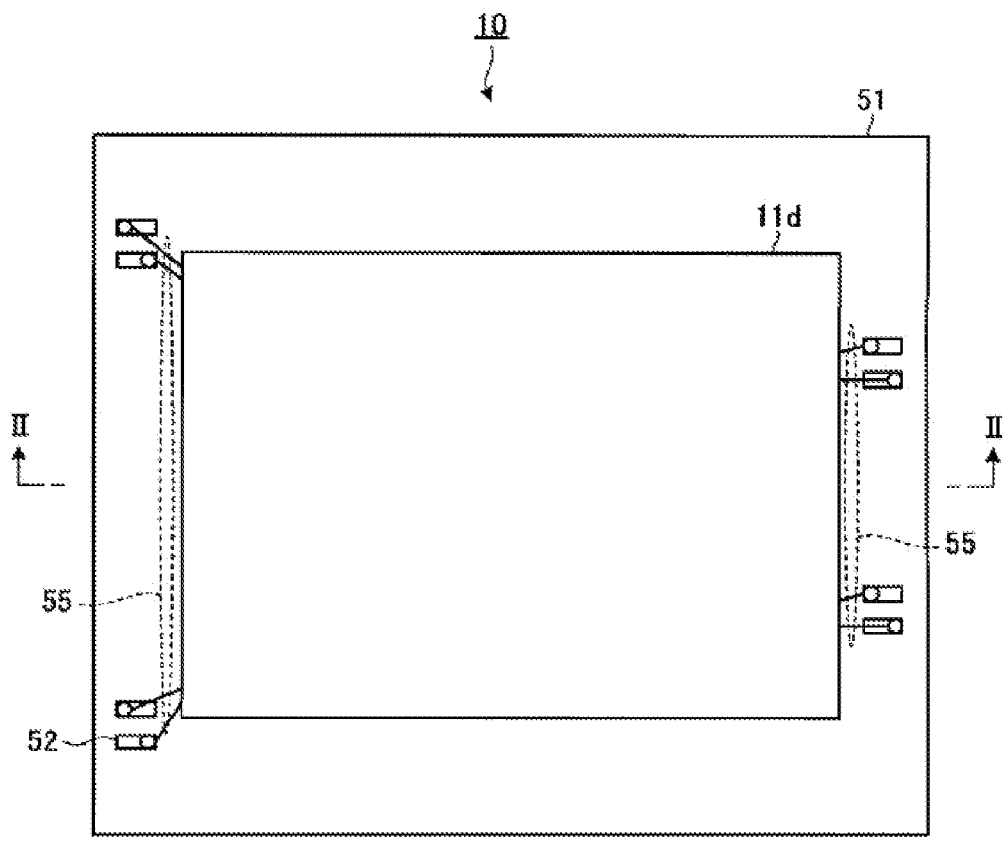
FIG. 6 is a diagram illustrating the layout of one multi-chip package.
Figure 7:
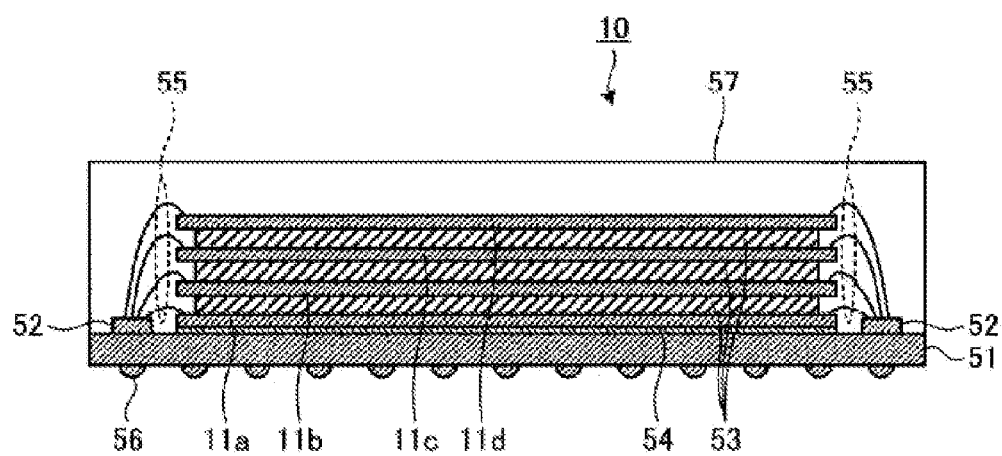
FIG. 7 is a cross-sectional view illustrating the multi-chip package.

FIG. 6 is a diagram illustrating the layout of 1 multi-chip package 10. FIG. 7 is a cross-sectional view illustrating the multi-chip package 10 taken across II-II as shown in FIG. 6.

On the substrate 51, the following parts are sequentially laminated: a memory chip 11a, a spacer 53, a memory chip 11b, a spacer 53, a memory chip 11c, a spacer 53, and a memory chip 11d. As the bottom layer, the memory chip 11a is anchored to the substrate 51 by an underfill 54 made of a resin.

On the substrate 51, multiple terminals (bonding pads) 52 are arranged. The pins disposed in the memory chips 11a to 11d are electrically connected to the terminals 52 on the substrate 51 via the bonding wires 55. The multiple memory chips 11a to 11d and the bonding wires 55 laminated onto the substrate 51 are sealed off by the molding resin 57. Also, solder balls 56 are arranged on the lower surface of the substrate 51. The solder balls 56 are electrically connected to the terminals 52. The NAND memory 1, for example, is soldered and assembled together with the transfer controller 2 and the RAM 3 on a printed circuit board equipped in the SSD 100. The various types of signals from the transfer controller 2 are input via the solder balls 56, the terminals 52, and the bonding wires 55 to the pins equipped in the memory chips 11a to 11d.

In the above, the multi-chip package 10 has been explained with a BGA (Ball Grid Array) package structure. However, it may also have a PGA (Pin Grid Array) package structure or other package structure.

Figure 8:
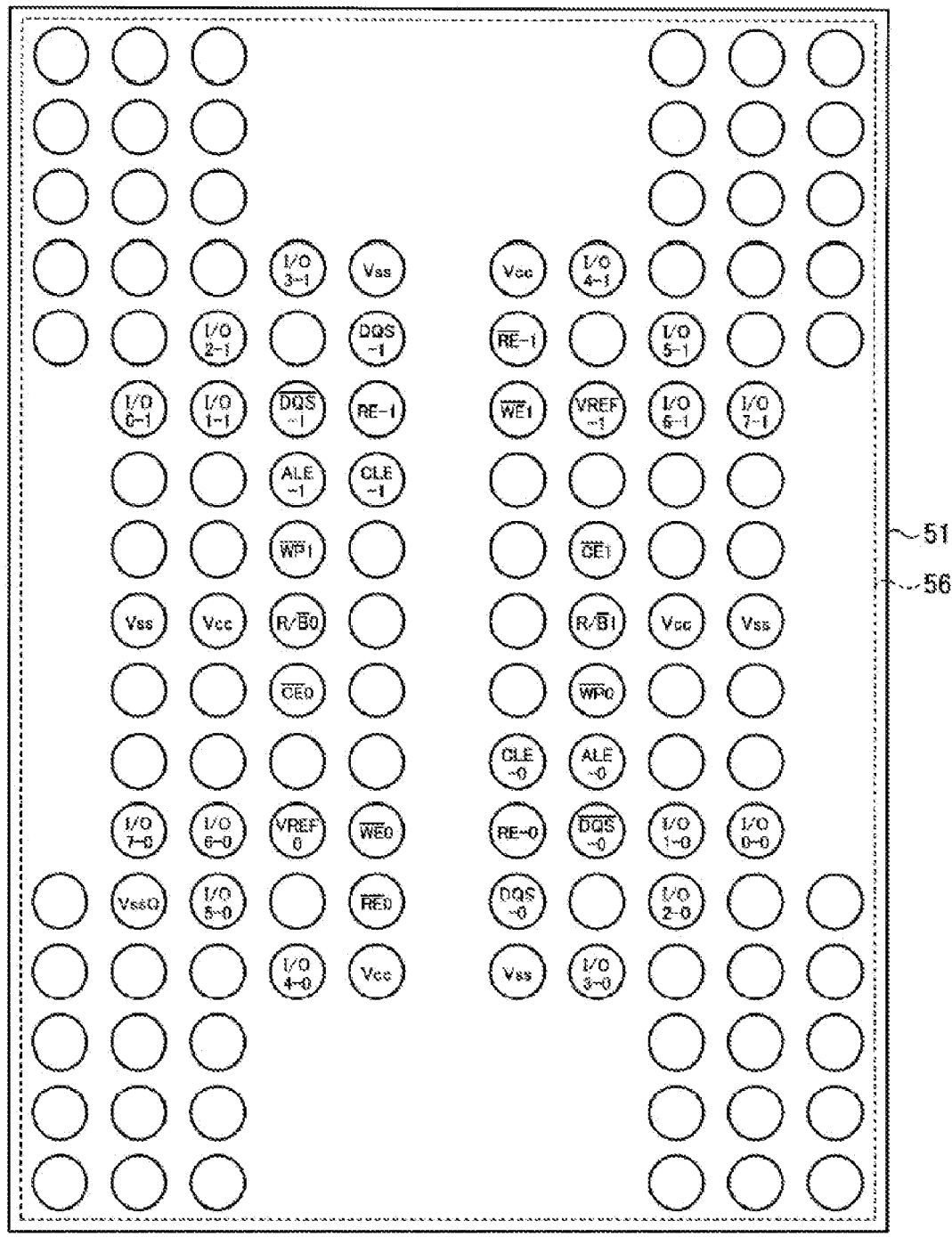
FIG. 8 is a diagram illustrating an example of the configuration of the solder balls of the multi-chip package.

FIG. 8 is a diagram illustrating an example of a configuration of the solder balls 56 of the multi-chip package 10. As shown in the figure, on the substrate 51, solder balls 56 are provided that constitute the 0-series signal line group (R/E0 terminals) CE0, CLE0, ALE0, WE0, RE0, WP0, DQS0, I/O-0, (I/O 0-0 to I/O 7-0), and solder balls 56 are provided that constitute the 1-series signal line group (R/E1 terminals) CE1, CLE1, ALE1, WE1, RE1, WP1, DQS1, I/O-1, (I/O 0-1 to I/O 7-1).

In this figure, the blank solder balls 56 indicate unused solder balls 56.

In the following section, the composition of the memory chips 11a to 11d will be explained in detail. The memory chips 11a to 11d have the same composition so that in the following only the composition of memory chip 11a will be explained as a typical memory chip.

Figure 9:
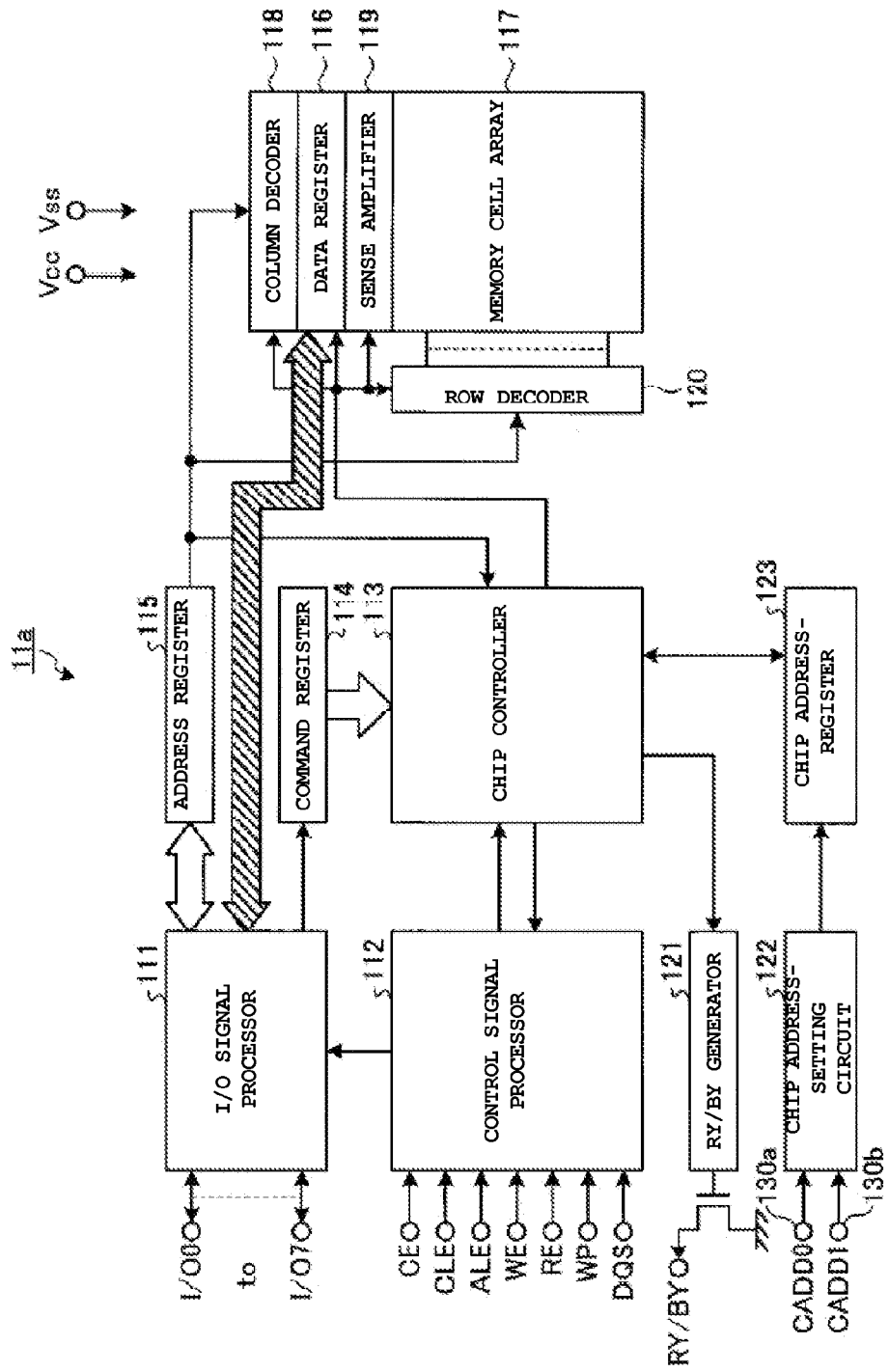
FIG. 9 is a block diagram illustrating the arrangement of the memory chips that form the multi-chip package in the first embodiment.

FIG. 9 is a block diagram illustrating the composition of memory chip 11a. As shown in the figure, memory chip 11a has an I/O signal processor 111, a control signal processor 112, a chip controller 113, a command register 114, an address register 115, a data register 116, a memory cell array 117, a column decoder 118, a sense amplifier 119, a row decoder 120, an RY/BY (ready/busy) generator 121, a chip address-setting circuit 122, and the chip address register 123.

Here, the chip controller 113 is a state transition circuit (also known as a so-called "state machine") that transitions the state (for example, "ready" or "busy") on the basis of the various types of control signals received via the control signal processor 112, and it controls the overall operation of the memory chip 11a. The RY/BY generator 121 makes transitions between the ready state (R) and the busy state (B) for the state of the RY/BY signal line under the control of the chip controller 113.

The I/O signal processor 111 is a buffer circuit for transceiving the I/O signal with the transfer controller 2 via the I/O signal line. The I/O signal processor 111 distributes the address, command, and data (i.e., write data) fetched as the I/O signal to the address register 115, the command register 114, and the data register 116 for storage, respectively.

Because the I/O signal line is an 8-bit signal line, the I/O signal line can transfer 8-digit addresses en bloc. In contrast, at present the memory capacity of each memory chip 11a is high enough that in many case the digit number of the address sent from the transfer controller 2 is over 8. Consequently, in the I/O signal processor 111, the address of the access destination is divided into multiple rounds for transmission via the 8-bit I/O signal line. The address register 115 stores the address that has been divided for sending in multiple rounds, and it then combines them into a single address.

The high-order 2 bits of the combined address are adopted as the chip identification bits for identifying memory chip 11a. Thus, the combined address contains the following contents counting from the highest order: a chip identification bit (chip address), a row address, and a column address. The chip address is read by the chip controller 113, the row address is read by the row decoder 120, and the column address is read by the column decoder 118.

The memory cell array 117 has a composition such that the NAND type memory cells are arranged as a matrix, and it stores the write data from the host device 200.

The row decoder 120, the column decoder 118, and the sense amplifier 119 execute access to the memory cell array 117 under the control of the chip controller 113. More specifically, the row decoder 120 selects the word line corresponding to the read row address, and it activates the selected word line. The column decoder 118 selects and activates the bit line corresponding to the read column address. The sense amplifier 119 applies a voltage on the bit line selected by the column decoder 118, and it writes the data stored in the data register 116 to the memory cell transistor located at the cross point between the word line selected by the row decoder 120 and the bit line selected by the column decoder 118. Also, the sense amplifier 119 reads the data stored in the memory cell transistor via the bit line, and it stores the read data in the data register 116. The data stored in the data register 116 is sent via the data line to the I/O signal processor 111, and it is then transferred from the I/O signal processor 111 to the transfer controller 2.

The control signal processor 112 receives input from various types of control signals, and on the basis of the received control signals, it executes allotment of the I/O signal received by the I/O signal processor 111 to the register of the storage destination. In addition, the control signal processor 112 transfers the received control signal to the chip controller 113.

At start up, the chip address-setting circuit 122 sets the 2-bit chip address set values (CADD0, CADD1) that are externally input via the chip address-setting pins 130a, 130b as the chip address of the initial state in the chip address register 123. The chip controller 113 compares the chip address stored in the chip address register 123 with the chip address input from the command register 114 and determines whether its own memory chip 11a makes a request for operation.

The I/O signal processor 111, the control signal processor 112, the chip controller 113, the command register 114 and the address register 115 operate as the address rewrite module that rewrites the chip address stored in the chip address register 123 by the operation under the control of the transfer controller 2.

Figure 10:
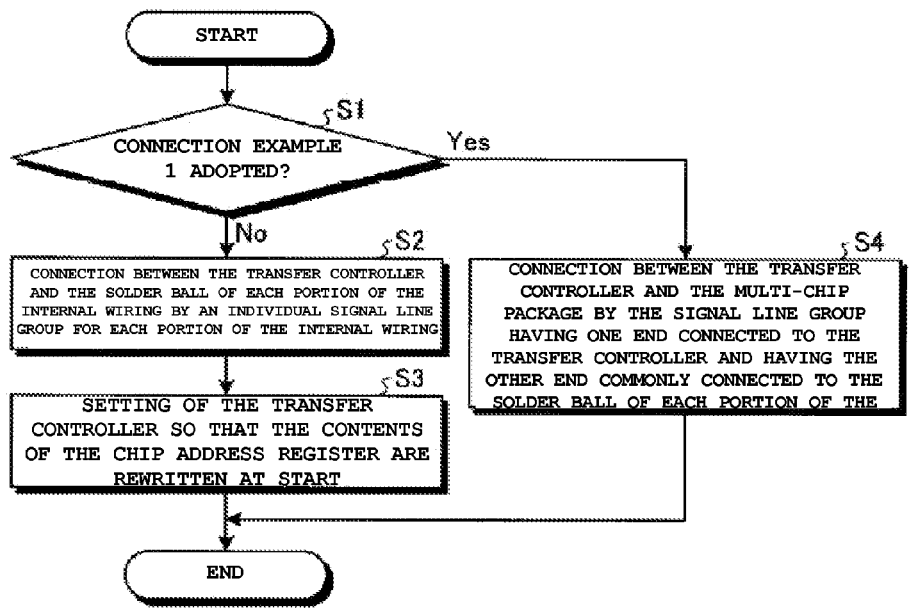
FIG. 10 is a flow chart illustrating the method for assembling the multi-chip package on the SSD of the first embodiment.

In the following, the method for assembling the multi-chip package 10 on the SSD 100 will be explained. FIG. 10 is a flow chart illustrating the method for assembling the multi-chip package 10 on the SSD 100 in the first embodiment. Initially, the manufacturer makes a decision as to whether Connection Example 1 or Connection Example 2 will be adopted (step S1). When Connection Example 2 is adopted (NO in step S1), the manufacturer connects the transfer controller 2 and the multi-chip package 10 to each other by the signal line group (connection wiring 210) for each portion of the internal wiring 140. In other words, each signal line group is independently coupled to the transfer controller. (step S2). Next, the manufacturer sets the transfer controller 2 by rewriting the contents of the chip address register 123 when the transfer controller 2 is started up (step S3). Here, the operation of the transfer controller 2 is set so that the content of the chip address register 123 that is rewritten at start up refers to operation, and the firmware that controls the MPU 24 is set so that the test command is issued to each of the memory chips 11c to 11d so that the chip address of the memory chip 11c is rewritten by "00" and the chip address of the memory chip 11d is rewritten by "01". When Connection Example 1 is adopted (YES in step S1), the manufacturer connects the transfer controller 2 with the multi-chip package 10 by the signal line group (connection wiring 210) that has one end connected to the transfer controller 2 and has the other end commonly connected to the solder ball 56 for each portion of the internal wiring 140 (step S4). With the operation in step S3 or step S4, the assembly of the multi-chip package 10 comes to an end.

Figure 11:
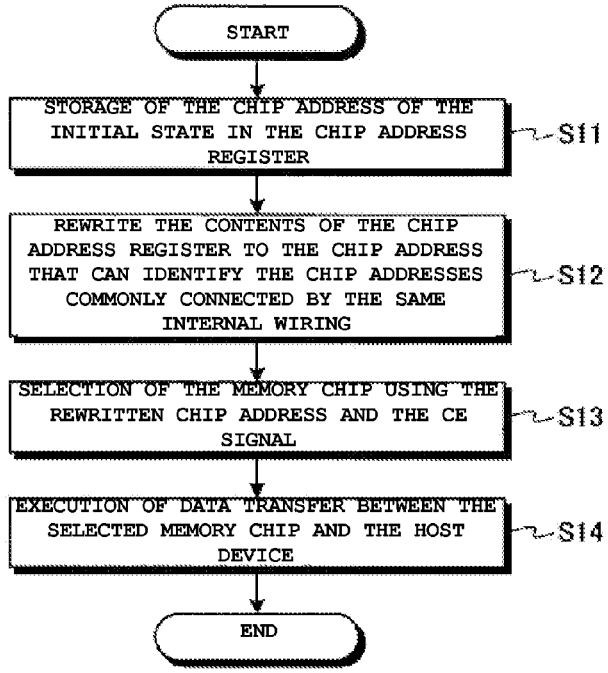
FIG. 11 is a flow chart illustrating the operation of the SSD when the first connection example is adopted.

FIG. 11 is a flow chart illustrating the operation of the SSD 100 when Connection Example 1 is adopted. When the SSD 100 is started up, the chip address-setting circuit 122 has the contents set in the chip address-setting pins 130a, 130b stored in the chip address register 123 as the chip address of the initial state (step S11). Then, on the basis of the firmware set in step S3, the transfer controller 2 rewrites the contents of the chip address register 123 with a chip address that can be identified among the memory chips commonly connected to the same portion of the internal wiring 140 (step S12). For example, the transfer controller 2 issues the test command to rewrite the chip address of the memory chip 11c by "00" and the test command to rewrite the chip address of the memory chip 11d by "01". Immediately after start up, in the chip address register 123 of the memory chips 11a to 11d, the chip address of the initial state that can identify the memory chips 11a to 11d is set, so that the transfer controller 2 can assign the issuing destination of the test command using the chip address of the initial state. In the memory chip 11c, as the test command is received, the I/O signal processor 111, the control signal processor 112, the chip controller 113, the command register 114, and the address register 115 work together to rewrite the contents of the chip address register 123 by "00". Also, in the memory chip 11d, as the test command is received, the I/O signal processor 111, the control signal processor 112, the chip controller 113, the command register 114, and the address register 115 work together to rewrite the contents of the chip address register 123 by "01". Next, the transfer controller 2 uses the rewritten chip address and the CE signal to select the memory chip of the access destination among the memory chips 11a to 11d (step S13) and executes the data transfer between the selected memory chip and the host device 200 (step S14). The operation then ends.

Figure 12:
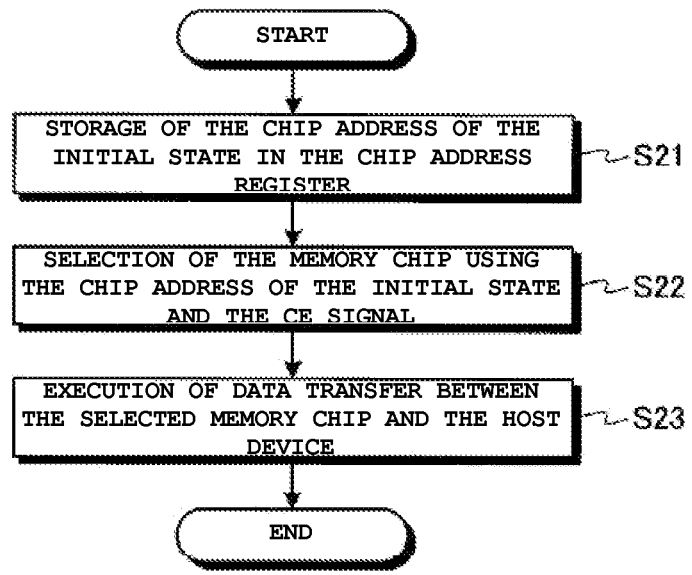
FIG. 12 is a flow chart illustrating the operation of the SSD when the second connection example is adopted.

FIG. 12 is a flow chart illustrating the operation of the SSD 100 when Connection Example 2 is adopted. When the SSD 100 starts up, the chip address setting circuit 122 has the contents set in the chip address-setting pins 130a, 130b as the chip address of the initial state in the chip address register 123 for each of memory chips 11a to 11d (step S21). Next, the transfer controller 2 uses the chip address of the initial state stored in the chip address register 123 and the CE signal to select the memory chip of the access destination among the memory chips 11a to 11d (step S22), and executes the data transfer between the selected memory chip and the host device 200 (step S23). The operation then ends.

As explained above, according to the first embodiment of the present disclosure, the multi-chip package 10 has one or more memory chips 11a to 11d (the first group), portions of an internal wiring 140 for each chip that are common connections of the CE signal for a group of memory chips (the second group) that includes one or more memory chips, and one solder ball 56 for each of the portions of the internal wiring 140 for feeding the external CE signal to the internal wiring 140. Each of the memory chips 11a to 11d has a chip address register 123 that operates as the chip address memory region configured to store the rewritten chip address. In addition, each of the memory chips 11a to 11d includes an I/O signal processor 111, a control signal processor 112, a chip controller 113, a command register 114, and an address register 115 that together operate as the address rewrite module for rewriting the chip address stored in the chip address register 123 by an external operation. Consequently, the manufacturer of the SSD 100 can adopt the desired connection relationships among the connections of Connection Example 1 and Connection Example 2. Consequently, the design of the SSD 100 can be highly flexible. For example, when Connection Example 1 is adopted, the transfer controller 2 can use the chip address in the initial state and the CE signal to assign the memory chip with the access destination. Additionally, when Connection Example 2 is adopted, the transfer controller 2 can rewrite the chip address of the initial state stored in the chip address register 123 to the chip address that can identify the chip addresses (that is, the memory chips in the second group) that are commonly connected by the internal wiring 140. Furthermore, the transfer controller 2 can use the rewritten chip address and the CE signal to assign the memory chip of the access destination.

Each of the memory chips 11a to 11d also has a chip address-setting circuit 122 that operates as the initial value-setting module configured to set the chip address at the initial state, where the chip addresses allow identification of the memory chips 11a to 11d in the chip address memory region belonging to the same memory chip at start up. With such an arrangement, by using the chip address of the initial state immediately after start up, the transfer controller 2 can identify the memory chips 11a to 11d.

In addition, feeding units for providing the chip address in the initial state are not limited to the chip address-setting pins 130a, 130b. For example, one may also adopt a scheme in which the chip address of the initial state is preset in a ROM fuse or other nonvolatile memory, and the chip address-setting circuit 122 reads the chip address of the initial state from the nonvolatile memory and stores it in the chip address register 123.

Second Embodiment

According to the second embodiment, the chip address of the initial state is preset in a ROM fuse as rewritable nonvolatile memory. The manufacturer can directly rewrite the chip address in the nonvolatile memory when the multi-chip package 10 is assembled on the SSD 100.

Figure 13:
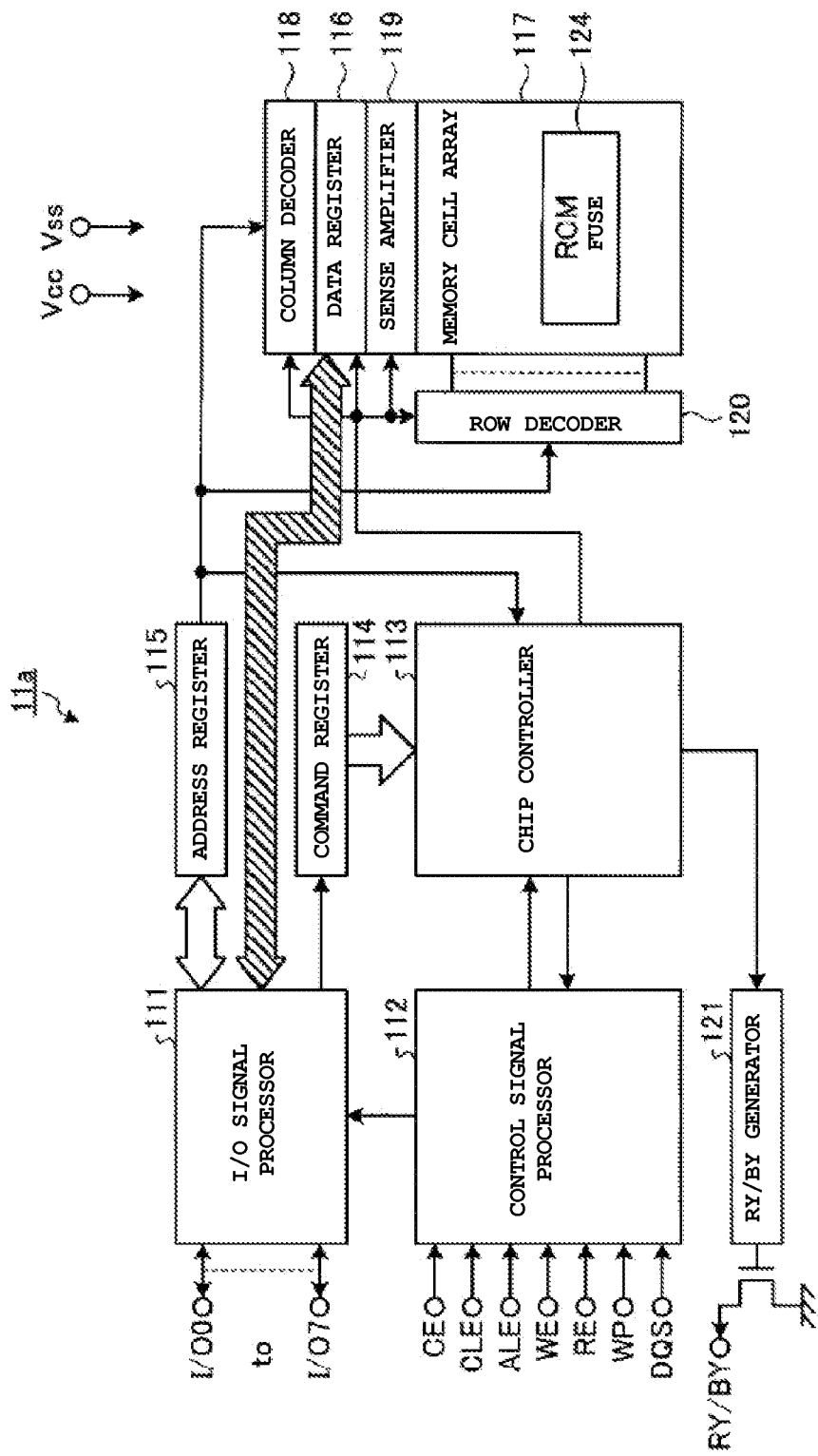
FIG. 13 is a block diagram illustrating the constitution of the memory chips that form the multi-chip package according to a second embodiment.

FIG. 13 is a diagram illustrating the composition of the memory chips 11a to 11d that form the multi-chip package 10 according to the second embodiment. Because the memory chips 11a to 11d have the same composition, only the composition of the memory chip 11a will be explained as a representative. The same reference numbers used above in the first embodiment are adopted here, and they will not be explained in detail again.

As shown in the figure, the memory chip 11a has an I/O signal processor 111, a control signal processor 112, a chip controller 113, a command register 114, an address register 115, a data register 116, a memory cell array 117, a column decoder 118, a sense amplifier 119, a row decoder 120, and an RY/BY generator 121. A portion of the memory cell array 117 is used as the ROM fuse 124 that stores the chip address.

In the ROM fuse 124, the chip address of the initial state is pre-stored. The I/O signal processor 111, the control signal processor 112, the chip controller 113, the command register 114, and the address register 115 work together to work as an address rewrite module that rewrites the chip address stored in the ROM fuse 124 under control of the transfer controller 2.

Figure 14:
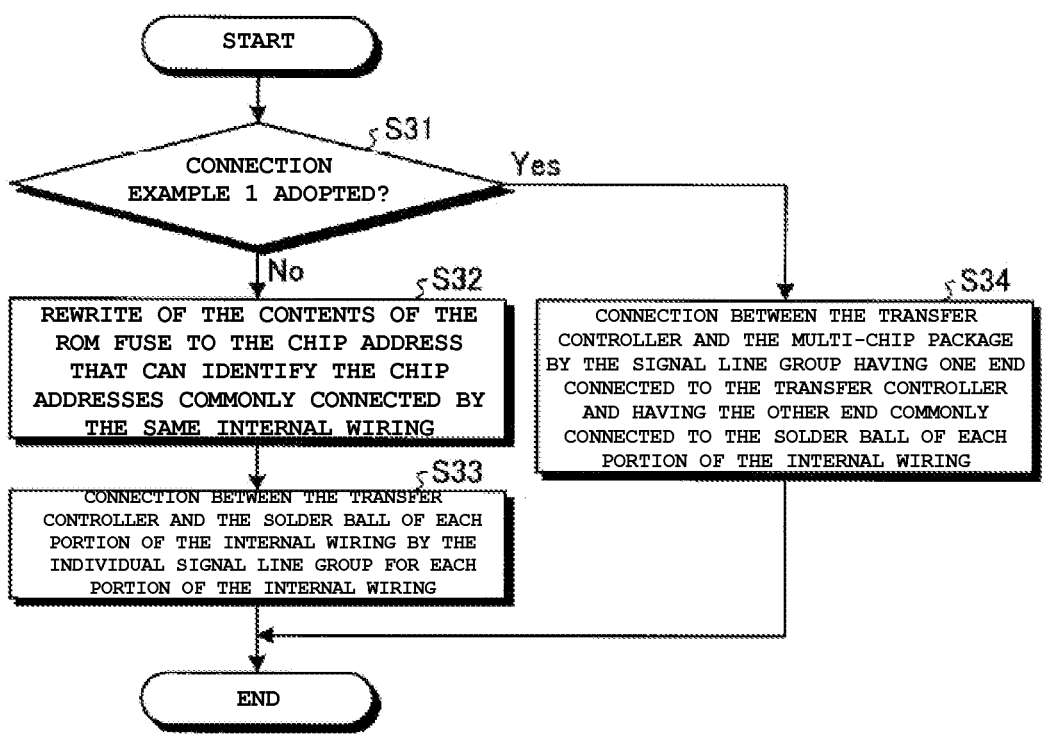
FIG. 14 is a flow chart illustrating the method for assembling the multi-chip package on the SSD according to the second embodiment.

FIG. 14 is a flow chart illustrating the method for assembling the multi-chip package 10 on the SSD 100 in the second embodiment. First, the manufacturer decides whether Connection Example 1 will be adopted or Connection Example 2 will be adopted (step S31). When Connection Example 2 is adopted (NO in step S31), the manufacturer uses a prescribed device to manipulate the chip address rewrite region so that the contents of the ROM fuse 124 are rewritten such that it is possible to identify the memory chips that are commonly connected to the same portion of the internal wiring 140 (step S32). That is, the manufacturer rewrites the chip address of the memory chip 11c with "00", and it rewrites the chip address of the memory chip 11d with "01". Next, the transfer controller 2 and the multi-chip package 10 are connected to each other by each signal line group (connection wiring 210) for each portion of the internal wiring 140 (step S33). When Connection Example 1 is adopted (YES in step S31), the manufacturer has the transfer controller 2 and the multi-chip package 10 connected to each other by the signal line group (connection wiring 210) that has one end connected to the transfer controller 2 and has the other end commonly connected to the solder ball 56 one for each portion of the internal wiring 140 (step S34). By the operation of step S33 or step S34, assembly of the multi-chip package 10 is completed.

In this way, according to the second embodiment, in its arrangement, the chip address of the initial state is stored in the ROM fuse as the rewritable nonvolatile memory, and the contents of the ROM fuse can be rewritten externally. Consequently, the manufacturer of the SSD 100 can adopt the desired connection relationships of either Connection Example 1 or Connection Example 2. Consequently, it is possible to have high flexibility in the design of the SSD 100.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed:

1. A multi-chip package comprising:
a first group of memory chips that includes a first memory chip and a second memory chip;
a second group of memory chips that includes at least one memory chip;
a first internal wiring system that couples the first memory chip and the second memory chip to a first terminal configured to receive a chip-enable signal; and
a second internal wiring system that couples the at least one memory chip to a second terminal configured to receive the chip-enable signal,
wherein the first memory chip and the second memory chip each comprises a chip address memory region configured to store an address associated with the memory chip, and an address rewrite module configured to rewrite the address associated with the memory chip and stored in the chip address memory region in response to an external operation.

2. The multi-chip package according to claim 1, wherein the first memory chip and the second memory chip each include an initial value-setting module configured to set the address associated with the memory chip to an initial state.

3. The multi-chip package according to claim 2, wherein the first memory chip and the second memory chip each include address-setting pins and the initial value-setting module is configured to set the initial state of the address associated with the memory chip based on voltages applied to the address-setting pins.

4. The multi-chip package according to claim 3, wherein one of the address-setting pins is configured to couple the memory chip to a supply voltage and another of the address-setting pins is configured to be coupled to a ground voltage.

5. The multi-chip package according to claim 2, wherein the chip address memory region includes a nonvolatile memory and the initial value-setting module is configured to set the initial state of the address associated with the memory chip based on a value stored in the nonvolatile memory.

6. The multi-chip package according to claim 1, wherein the first terminal is configured to couple the first memory chip to a transfer controller of a memory system and the second terminal is configured to couple the second memory chip to the transfer controller of the memory system.

7. The multi-chip package according to claim 6, wherein the first terminal and the second terminal are electrically coupled so that the first group of memory chips and the second group of memory chips are each configured to receive the same chip-enable signal.

8. The multi-chip package according to claim 6, wherein the first terminal and the second terminal are independently coupled to the transfer controller of the memory system so that the first group of memory chips and the second group of memory chip each receive separate chip-enable signals.

9. The multi-chip package according to claim 8, wherein the first memory chip includes an address rewrite module configured to rewrite the address associated with the first memory chip that is stored in the chip address memory region of the first memory chip, and the second memory chip includes an address rewrite module configured to rewrite the address associated with the second memory chip that is stored in the chip address memory region of the second memory chip.

10. The multi-chip package according to claim 9, wherein the address rewrite module of the first memory chip is configured to rewrite the address associated with first memory chip in response to an external operation and the address rewrite module of the second memory chip is configured to rewrite the address associated with second memory chip in response to the external operation.

11. The multi-chip package according to claim 1, wherein the first internal wiring system includes at least one of an input/output signal line, a control signal line, and a ready/busy signal line.

12. A memory system comprising:
a first group of memory chips that includes a first memory chip and a second memory chip;
a second group of memory chips that includes at least one memory chip;
a first internal wiring system that couples the first memory chip and the second memory chip to a first terminal configured to receive a first chip-enable signal;
a second internal wiring system that couples the at least one memory chip to a second terminal configured to receive a second chip-enable signal; and
a transfer controller configured to select a memory chip in the first group of memory chips as an access destination and transfer data between the selected memory chip and a host device,
wherein the first terminal and the second terminal are independently coupled to the transfer controller, and the first memory chip and the second memory chip each comprises a rewritable chip address memory area, an address rewrite module configured to rewrite contents of the chip address memory area in response to an external operation, and an initial value-setting module that is configured to set an initial address value selected to associate the memory chip with the first group of memory chips at start up, and
wherein the transfer controller is configured to rewrite the initial address value associated with the first memory chip and the initial address value associated with the second memory chip to respective rewritten address values that are selected to identify the first group of memory chips when selecting the access destination.

13. The multi-chip package according to claim 12, wherein the first memory chip and the second memory chip each include address-setting pins and the initial value-setting module of the first memory chip and the second memory chip are each configured to set initial address state based on voltages applied to the address-setting pins.

14. The multi-chip package according to claim 12, wherein the rewritable chip address memory area of the first memory chip and the second memory chip each includes a nonvolatile memory and the initial value-setting module of the first memory chip and the second memory chip are each configured to set initial address state based on a value stored in the nonvolatile memory.

15. The multi-chip package according to claim 14, wherein the nonvolatile memory of the rewritable chip address memory area of the first memory chip and the second memory chip comprises a read only memory (ROM) fuse.

16. The multi-chip package according to claim 12, wherein the first internal wiring system includes as least one of an input/output signal line, a control signal line, and a ready/busy signal line.

17. The multi-chip package according to claim 12, wherein the transfer controller uses the rewritten address value associated with the first memory chip and the first chip-enable signal to select the access destination.

18. A memory system comprising:
a first group of memory chips that includes a first memory chip and a second memory chip;
a second group of memory chips that includes at least one memory chip;
a first internal wiring system that couples the first memory chip and the second memory chip to a first terminal configured to receive a chip-enable signal;
a second internal wiring system that couples the at least one memory chip to a second terminal configured to receive the chip-enable signal; and
a transfer controller configured to select a memory chip in one of the first group of memory chips and the second group of memory chips as an access destination and transfer data between the selected memory chip and a host device,
wherein the first terminal and the second terminal are electrically coupled so that the first memory chip and the second memory chip are each configured to receive the same chip-enable signal, and the first memory chip and the second memory chip each comprises a rewritable chip address memory area, and an initial value-setting module configured to set the address associated with the memory chip to an initial state, and
wherein the transfer controller is configured to select a memory chip as an access destination based on the initial state of the first memory chip, the second memory chip and the at least one memory chip.

19. The multi-chip package according to claim 18, wherein the first memory chip and the second memory chip each include address-setting pins and the initial value-setting module of the first memory chip and the second memory chip are each configured to set initial address state based on voltages applied to the address-setting pins.

20. The multi-chip package according to claim 18, wherein the rewritable chip address memory area of the first memory chip and the second memory chip each includes a nonvolatile memory and the initial value-setting module of the first memory chip and the second memory chip are each configured to set initial address state based on a value stored in the nonvolatile memory.

* * * * *